United States Patent
Chia et al.

(10) Patent No.: US 9,927,852 B2
(45) Date of Patent: Mar. 27, 2018

(54) SLOT-FILLER BLANKING TRAY

(71) Applicant: Cisco Technology, Inc., San Jose, CA (US)

(72) Inventors: Vic Chia, Sunnyvale, CA (US); Long Huu Dang, San Jose, CA (US); Hong Huynh, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 290 days.

(21) Appl. No.: 14/834,455

(22) Filed: Aug. 25, 2015

(65) Prior Publication Data

US 2017/0060197 A1 Mar. 2, 2017

(51) Int. Cl.
*G06F 1/20* (2006.01)
*H05K 7/20* (2006.01)
(Continued)

(52) U.S. Cl.
CPC ............ *G06F 1/20* (2013.01); *A47B 47/0075* (2013.01); *G06F 1/182* (2013.01); *G06F 1/183* (2013.01);
(Continued)

(58) Field of Classification Search
CPC ..... A47B 47/0075; G06F 1/182; G06F 1/183; G06F 1/20; G06F 1/206; H05K 7/20127;
(Continued)

(56) References Cited

U.S. PATENT DOCUMENTS

| 4,894,749 | A | * | 1/1990 | Elko | ........................ G06F 1/20 165/104.33 |
| 4,931,904 | A | * | 6/1990 | Yiu | ..................... H05K 7/20172 361/690 |

(Continued)

FOREIGN PATENT DOCUMENTS

| GB | 2410134 A | * | 7/2005 | ......... H05K 7/20563 |
| JP | 3011158 B2 | | 2/2000 | |

OTHER PUBLICATIONS

Moss, David L., Rack Blanking Panels—To Fill or Not to Fill, A Dell Technical White Paper (2011).

(Continued)

*Primary Examiner* — Joshua E Rodden
(74) *Attorney, Agent, or Firm* — Samuel M. Katz (57) ABSTRACT

In one embodiment, a slot-filler blanking tray includes a vented blanking panel including a vented front panel, the vented blanking panel for fitting over an entrance to one slot of a computer equipment rack including support rails, and a panel arrangement including partition panels to form a slot partition for reversibly inserting into the one slot, supported by the support rails, the slot partition being formed either by unfolding the partition panels or fitting the partition panels together, wherein (a) the vented blanking panel and at least one partition panel of the partition panels are mechanically connected together, or (b) the vented blanking panel includes a first connecting element and the at least one partition panel includes a second connecting element to mechanically connect the vented blanking panel and the at (Continued)

least one partition panel together. Related apparatus and methods are also described.

20 Claims, 9 Drawing Sheets

(51) Int. Cl.
  *A47B 47/00* (2006.01)
  *G06F 1/18* (2006.01)
  *H05K 9/00* (2006.01)

(52) U.S. Cl.
  CPC ....... *H05K 7/20563* (2013.01); *H05K 9/0062* (2013.01)

(58) Field of Classification Search
  CPC ............. H05K 7/2039; H05K 7/20545; H05K 7/20563; H05K 7/20572; H05K 7/20709; H05K 7/20718; H05K 7/20736; H05K 9/0062
  USPC .......................................................... 211/26
  See application file for complete search history.

(56) References Cited

U.S. PATENT DOCUMENTS

| | | | | |
|---|---|---|---|---|
| 5,410,448 | A | * | 4/1995 | Barker ............... H05K 7/20572 361/691 |
| 8,040,673 | B2 | | 10/2011 | Krietzman |
| 8,502,087 | B2 | | 8/2013 | Medrano et al. |
| 8,630,087 | B1 | * | 1/2014 | Reynov ............... H05K 7/20563 361/679.5 |
| 2005/0157472 | A1 | | 7/2005 | Malone et al. |
| 2005/0225217 | A1 | * | 10/2005 | Nay .................... A47B 21/0314 312/208.1 |
| 2005/0281014 | A1 | * | 12/2005 | Carullo .............. H05K 7/20563 361/796 |
| 2010/0110628 | A1 | * | 5/2010 | Barrenechea ........... G06F 1/183 361/679.48 |
| 2011/0267775 | A1 | | 11/2011 | VanDerVeen et al. |
| 2014/0321037 | A1 | | 10/2014 | Zhao |

OTHER PUBLICATIONS

Eziblank, Blanking Panels, Cost Effective Blanking Panel Solution (2015).
EP Search Report, dated Dec. 8, 2016, cited in a corresponding application (EP App. No. 16177947.5).

* cited by examiner

SLOT-FILLER BLANKING TRAY

TECHNICAL FIELD

The present disclosure generally relates to slot-filler blanking trays for a computer equipment rack.

BACKGROUND

By way of introduction, a computer equipment rack for racked-mounted computer equipment typically includes a plurality of slots for mounting computer equipment therein. In an implementation, some of the slots may be fitted with computer equipment and some of the slots may be vacant. Vacant slots are typically filled with a blanking tray which serves two purposes. One purpose is to contain electromagnetic interference (EMI), the other purpose is to provide air cooling. A metal blanking tray, typically made out of sheet metal, provides robustness and EMI containment but is expensive to produce. The metal blanking tray is also expensive to ship due to weight and size. From an industry design aspect, the metal blanking tray may require silk-screen, label and other add-ons to achieve a higher-end look, particularly for an enterprise system, thus leading to higher unit cost. Different racks may be the same width, but may have different depths requiring different blanking trays to achieve effective baffling. One solution to achieve compact, low cost and a light weight design is to provide a faceplate to cover the entrance of the slot without using a tray. This design provides sufficient EMI containment. However, a drawback is lack of air flow partitioning between computer equipment items. Typical computer equipment items, e.g., line cards, each have several application-specific integrated circuits (ASICs) with heat sink attachments. To effectively cool the heat generating sources, cool air should be forced/baffled toward the heat sink fins. Thus, an extender toward the rear of the slot is generally necessary.

BRIEF DESCRIPTION OF THE DRAWINGS

The present disclosure will be understood and appreciated more fully from the following detailed description, taken in conjunction with the drawings in which.

DESCRIPTION OF EXAMPLE EMBODIMENTS

Overview

There is provided in accordance with an embodiment of the present invention, a slot-filler blanking tray including a vented blanking panel including a vented front panel with ventilation openings, the vented blanking panel for fitting over an entrance to one slot of a plurality of slots of a computer equipment rack for rack-mounted computer equipment, each of the plurality of slots having a depth, a width, and a height, and including a plurality of support rails for supporting a piece of computer equipment, and a panel arrangement including a plurality of partition panels to form a slot partition for reversibly inserting into the one slot, supported by the support rails of the one slot and extending from the entrance of the one slot into at least 70% of the depth of the one slot, the slot partition being formed either by unfolding the plurality of partition panels or fitting the plurality of partition panels together, wherein (a) the vented blanking panel and at least one partition panel of the plurality of partition panels are mechanically connected together, or (b) the vented blanking panel includes a first connecting element and the at least one partition panel includes a second connecting element to mechanically connect the vented blanking panel and the at least one partition panel together.

There is also provided in accordance with another embodiment of the present invention, a method of manufacturing a slot-filler blanking tray, the method including forming a vented blanking panel including a vented front panel with ventilation openings, the vented blanking panel for fitting over an entrance to one slot of a plurality of slots of a computer equipment rack for rack-mounted computer equipment, each of the plurality of slots including a plurality of support rails for supporting a piece of computer equipment thereon, and forming a panel arrangement including a plurality of partition panels to form a slot partition for reversibly inserting into the one slot, supported by the support rails of the one slot and extending from the entrance of the one slot to at least 70% of the depth of the one slot, wherein each one partition panel of the plurality of partition panels is formed either by (a) including a projection disposed at one edge of the one partition panel and a corresponding depression disposed at another edge of the one partition panel, the projection and the depression being formed so that the projection of the one partition panel may fit into the corresponding depression disposed in another partition panel of the plurality of partition panels to form the slot partition, or (b) including at least one part of a hinge element with the one partition panel for mechanically connecting the plurality of partition panels together so that when the plurality of partition panels are mechanically connected together, the plurality of partition panels can fold up on top of each other for storage and unfold to form the slot partition for inserting into the one slot, and mechanically connecting the vented blanking panel and at least one partition panel of the plurality of partition panels together or forming the vented blanking panel to include a first connecting element and the at least one partition panel to include a second connecting element, the first connecting element and the second connecting element being used to mechanically connect the vented blanking panel and the at least one partition panel together.

There is also provided in accordance with still another embodiment of the present invention a slot-filler blanking tray including a vented blanking panel including a plastic formed vented front panel with ventilation openings, and an electrically conductive material layer mechanically connected to the plastic formed vented front panel, the vented blanking panel for fitting over an entrance to one slot of a plurality of slots of a computer equipment rack for rack-mounted computer equipment, each of the plurality of slots having a depth, a width, and a height, and including a plurality of support rails for supporting a piece of computer equipment, the electrically conductive material layer being disposed on the vented front panel to provide electromagnetic shielding over the entrance to the one slot, and a panel arrangement including a plurality of plastic formed partition panels to form a slot partition for reversibly inserting into the one slot, supported by the support rails of the one slot and extending from the entrance of the one slot into the one slot, the slot partition being formed either by unfolding the plurality of partition panels or fitting the plurality of partition panels together, wherein (a) the vented blanking panel and at least one partition panel of the plurality of partition panels are mechanically connected together, or (b) the vented blanking panel includes a first connecting element and the at least one partition panel includes a second connecting element to mechanically connect the vented blanking panel and the at least one partition panel together.

DETAILED DESCRIPTION

Figure 1:
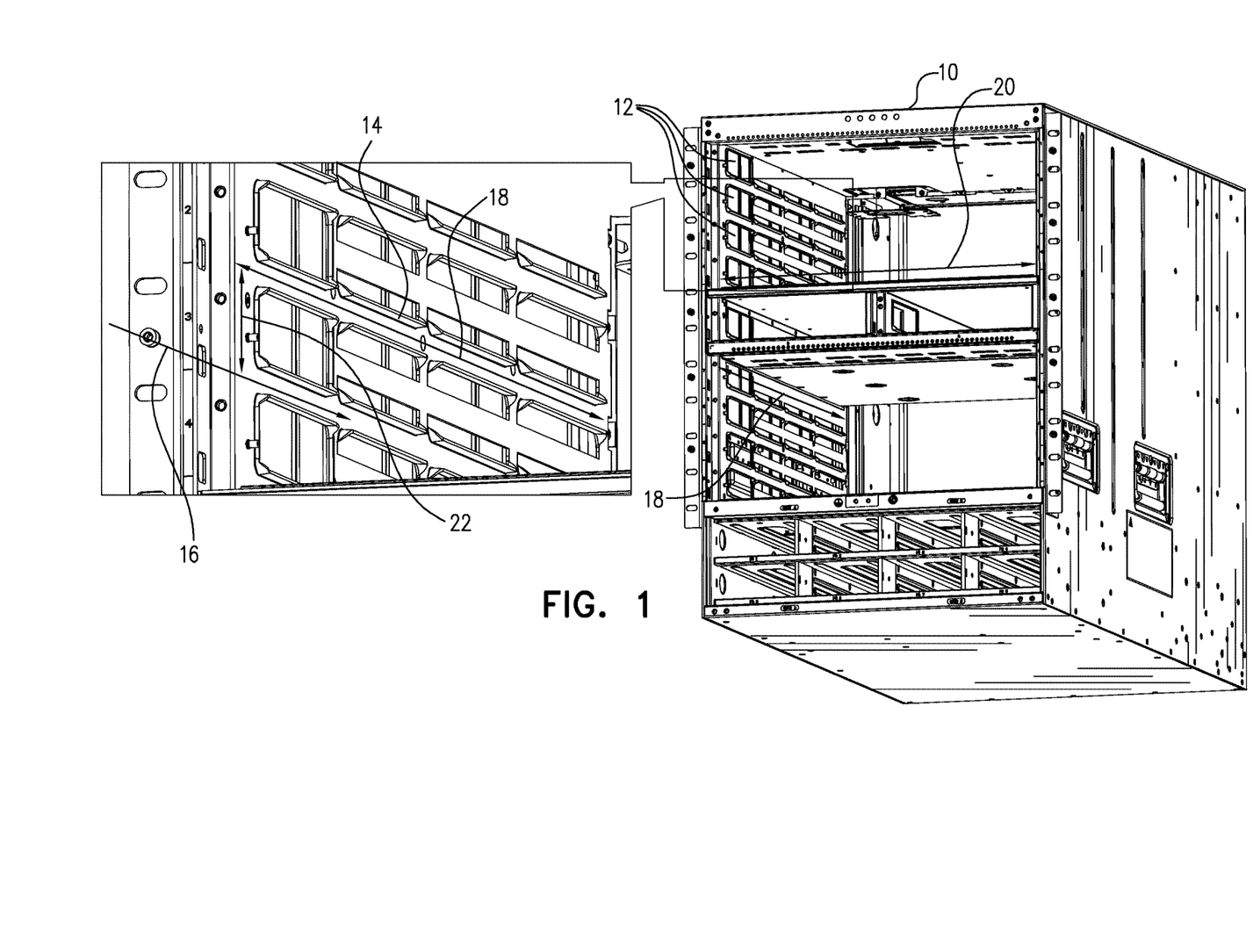
FIG. 1 is an isometric view of a computer equipment rack for rack-mounted computer equipment.

Reference is now made to FIG. 1, which is an isometric view of a computer equipment rack 10 for rack-mounted computer equipment. The computer equipment rack 10 may be designed for rack-mounting any suitable computer equipment, for example, but not limited to, line cards, router equipment or computer server equipment. The computer equipment rack 10 includes a plurality of slots 12. Each slot 12 has a depth (arrow 18), a width (arrow 20), and a height (arrow 22), and including a plurality of support rails 14, one support rail 14 on each side of the slot 12, for supporting a piece of computer equipment (not shown). Arrow 16 shows the direction of insertion of a piece of computer equipment or a blanking tray into the slot 12. The depth (arrow 18) of the slot 12 is defined as the distance from the front of the slot 12 to the back of the slot 12 measured in the direction of elongation of the support rails 14. The height (arrow 22) of the slot 12 is defined as the shortest distance between the same corresponding points on two adjacent support rails 14 disposed on the same side of the computer equipment rack 10, for example, the distance between the top of one support rail 14 and the top of an adjacent support rail 14. The width (arrow 20) is defined as the length of the elongated direction of the slot measured perpendicular to the sides of the computer equipment rack 10. The width (arrow 20) is measured in a direction perpendicular to the height (arrow 22) and has a length greater than the height (arrow 22).

Figure 2:
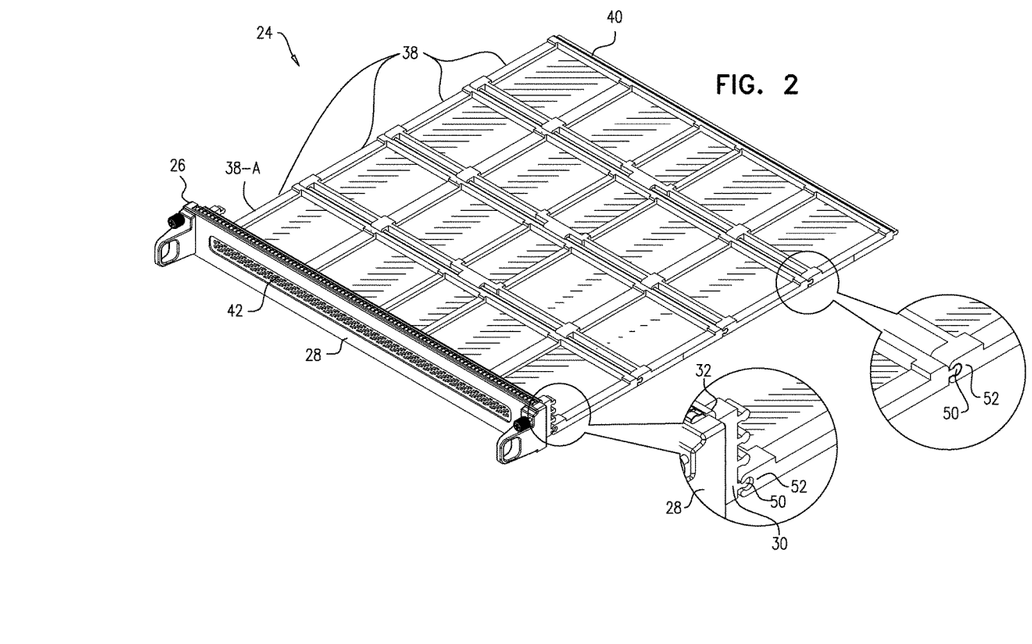
FIG. 2 is an isometric view of a slot-filler blanking tray constructed and operative in accordance with an embodiment of the present disclosure.

Reference is now made to FIG. 2, which is an isometric view a slot-filler blanking tray 24 constructed and operative in accordance with an embodiment of the present disclosure. The slot-filler blanking tray 24 typically includes a vented blanking panel 26 for fitting over an entrance to one of the slots 12 (FIG. 1). The vented blanking panel 26 includes a vented front panel 28 with ventilation openings 42, a rear panel 30 and an electrically conductive material layer 32 being sandwiched between, and mechanically connected to, the vented front panel 28 and the rear panel 30. The slot-filler blanking tray 24 includes a panel arrangement including a plurality of partition panels 38 that fit together to form a slot partition 40 for reversibly inserting into the slot 12. The slot partition 40 is supported by the support rails 14 (FIG. 1) of the slot 12 and extends from the entrance of the slot 12 into at least 70% of the depth (arrow 18 of FIG. 1) of the slot 12 in order to provide air baffling towards the back of the slot 12. The slot partition 40 may extend from the entrance of the slot 12 into at least 90% of the depth (arrow 18 of FIG. 1) of the slot 12 and typically extends substantially to the end of the slot 12. The vented blanking panel 26 and the partition panels 38 and how they are connected to each other are described in more detail below when FIG. 2 is referred to again.

Figure 3:
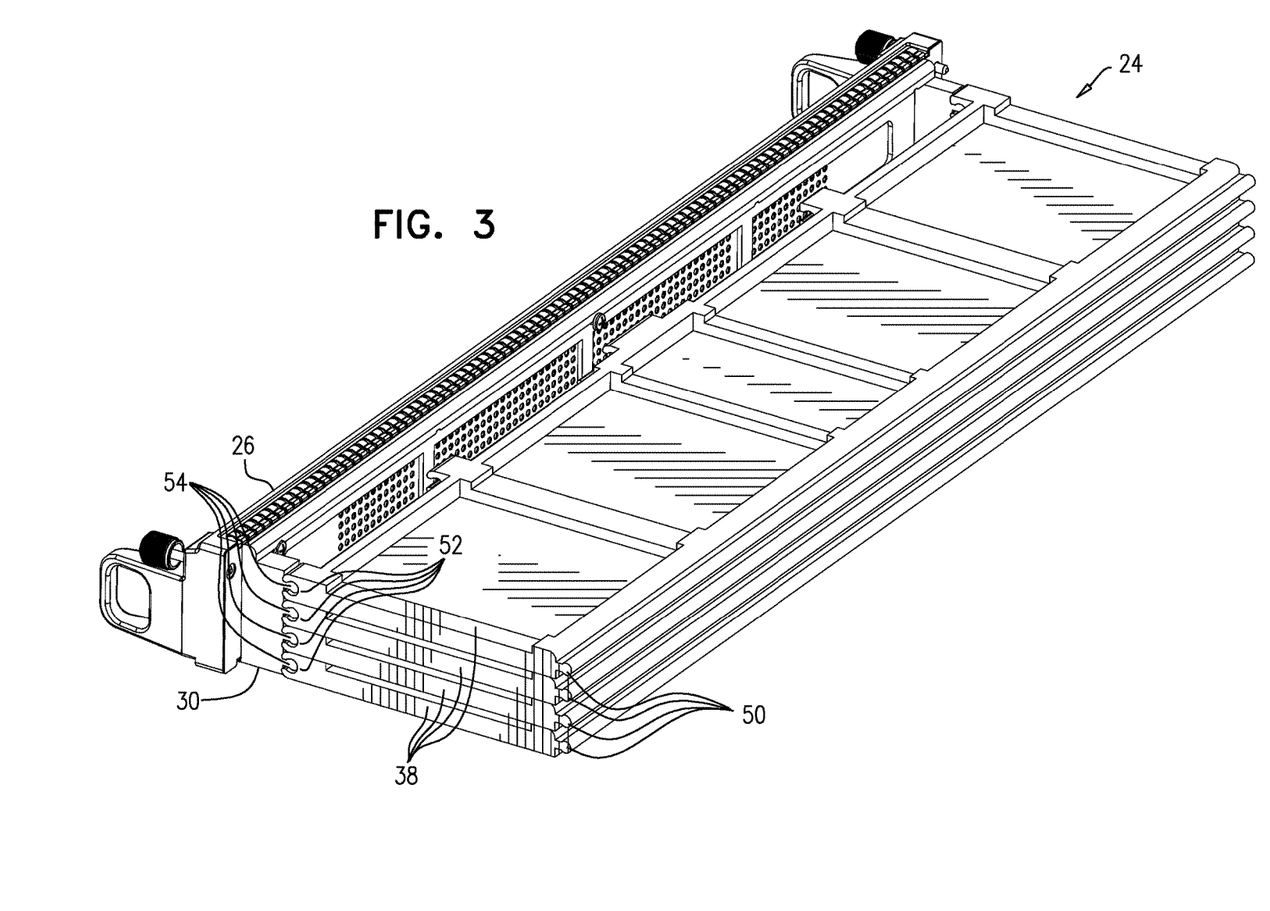
FIG. 3 is an isometric view of the slot-filler blanking tray of FIG. 2 in a shipping configuration.

Reference is now made to FIG. 3, which is an isometric view of the slot-filler blanking tray 24 of FIG. 2 in a shipping configuration. The partition panels 38 are shown stored against the rear panel 30 of the vented blanking panel 26. More details of the storage are described below when FIG. 3 is referred to again.

Figure 4:
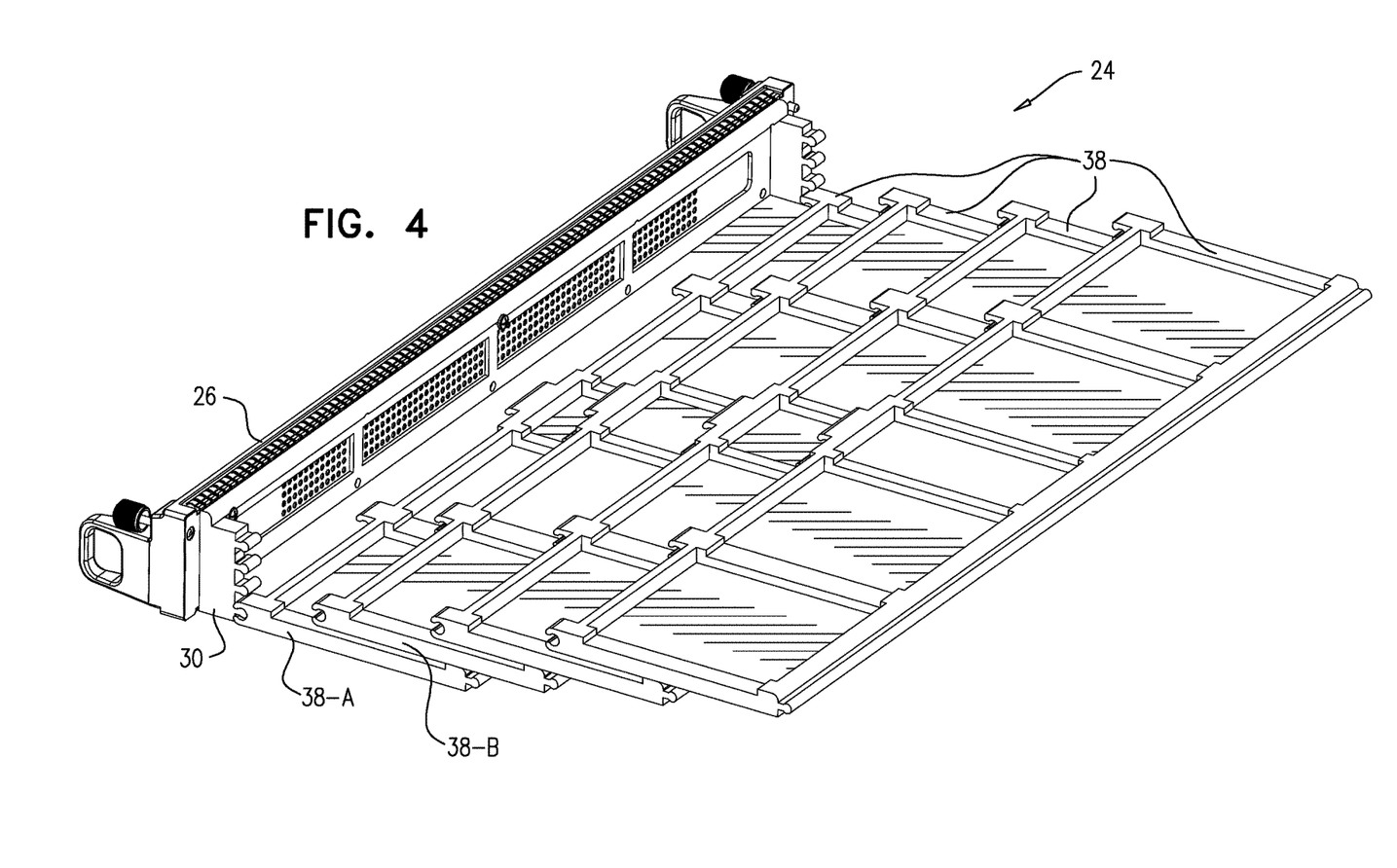
FIG. 4 is an isometric view of the slot-filler blanking tray of FIG. 2 with some of the partition panels being removed from their storage position.

Reference is now made to FIG. 4, which is an isometric view of the slot-filler blanking tray 24 of FIG. 2 with some of the partition panels 38 being removed from their storage position as shown in FIG. 3. One of the partition panels 38-A typically remains mechanically connected to the rear panel 30 of the vented blanking panel 26 during construction of the slot partition 40 (FIG. 2). Another one of the partition panels 38-B is snap fit into the partition panel 38-A during construction of the slot partition 40. Similarly each of the other partition panels 38 may snap fit into another partition panel 38 until the slot partition 40 is formed as shown in FIG. 2. It will be appreciated that the number of partition panels 38 that are slotted together to form the slot partition 40 may depend on the depth of the slot 12 (FIG. 1) so that the slot partition 40 depth may be varied according to the depth of the slot 12. The partition panels 38 are typically the same size but could be different sizes.

Figure 5:
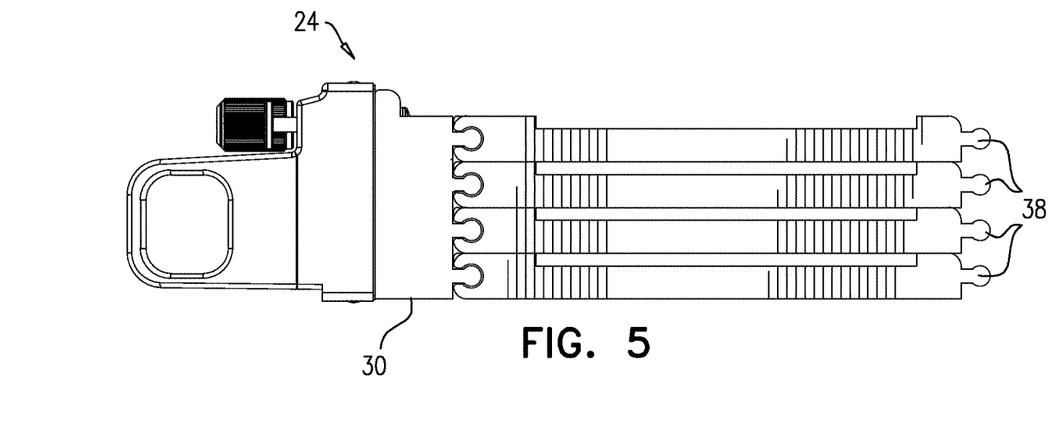
FIG. 5 is a side view of the slot-filler blanking tray of FIG. 2 in the shipping configuration.
Figure 6:
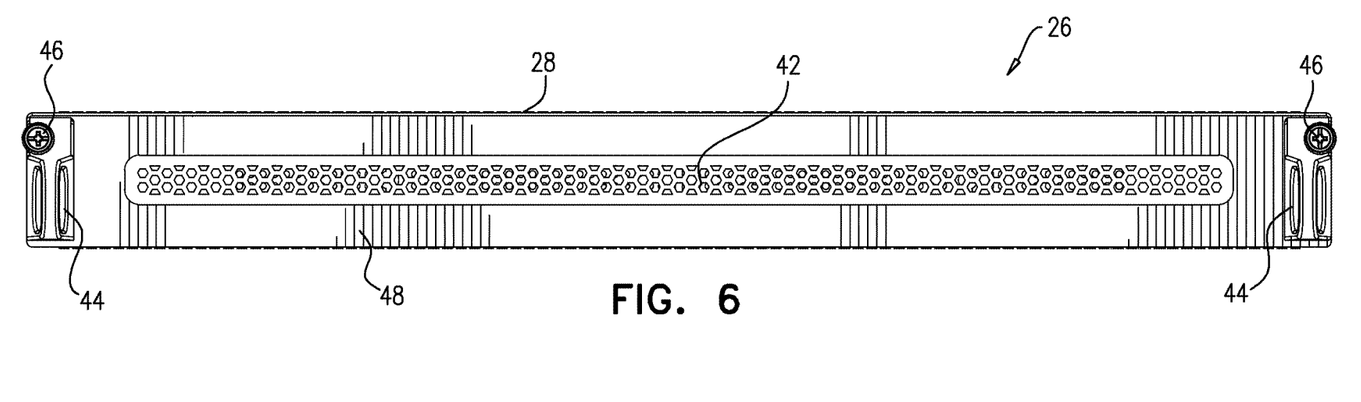
FIG. 6 is a front view of the vented blanking panel of the slot-filler blanking tray of FIG. 2.

Reference is now made to FIG. 5, which is a side view of the slot-filler blanking tray 24 of FIG. 2 in the shipping configuration. FIG. 5 illustrates very clearly how the partition panels 38 store against the rear panel 30 for compact shipping and storing when not in use. Not only is a single slot-filler blanking tray 24 compact in this form, a plurality of slot-filler blanking trays 24 may be packed in a dense arrangement within a shipping box, further reducing shipping expenses. Storage of the slot-filler blanking tray 24 (when all the partition panels 38 are stored against the rear panel 30) typically takes a lot less space to store than an assembled blanking tray or a non-modular blanking tray. This may be an advantage to a manufacturer or purchaser of the slot-filler blanking tray 24 who may need to store large quantities of the slot-filler blanking tray 24. Reference is now made to FIG. 6, which is a front view of the vented blanking panel 26 of the slot-filler blanking tray 24 of FIG. 2. The vented front panel 28 includes a handle 44 at each side of the front panel 28 for inserting the slot-filler blanking tray 24 into the slot 12 (FIG. 1) and removing the slot-filler blanking tray 24 from the slot 12. The vented front panel 28 includes a plurality, typically two, fastening elements 46 for fastening the slot-filler blanking tray 24 in the slot 12. The fastening elements 46 may comprise thumb screws (as shown in FIG. 6), sprung clips (not shown), snap features (not shown) or plastic latches (not shown), by way of example only. The vented front panel 28 and the rear panel 30 are typically plastic formed, for example, but not limited to, from polycarbonate (PC) or acrylonitrile butadiene styrene (ABS), for ease and economy of manufacture and to provide a light shipping weight. The plastic may be doped with a flame retardant, for example, but not limited to, according to UL 94V-0. UL 94 is a Standard for Safety of Flammability of Plastic Materials for Parts in Devices and Appliances testing is a plastics flammability standard released by Underwriters Laboratories of the USA. The standard classifies plastics according to how they burn in various orientations and thicknesses from lowest (least flame-retardant) to highest (most flame-retardant). V-0 specifies that burning stops within 10 seconds on a vertical specimen; drips of particles are allowed as long as they are not inflamed. The vented front panel 28 and/or the rear panel 30 may alternatively be formed from any other suitable material for example, but not limited to, fiber glass or metal. The vented front panel 28 and/or the rear panel 30 may be formed from any suitable combination of materials, such as plastic, metal and/or fiber glass. When the vented front panel 28 is formed from a moldable material, design features such as texture 48, the ventilation openings 42, the handles 44 and product ID (not shown) may be molded on the vented front panel 28, thus reducing the overall unit cost.

Reference is again made to FIG. 2. The slot partition 40 is formed by fitting the partition panels 38 together, typically by pressure fitting, click-fitting or interlocking, thereby providing a modular scalable slot-filler blanking tray which can be easily configured to fill various depths of slots 12 (FIG. 1). Each partition panel 38 may include one or more projections 50 disposed at one edge of the partition panel 38 and one or more corresponding depressions 52 disposed at another (opposite) edge of the partition panel 38. The projection(s) 50 and the depression(s) 52 are formed so that the projection(s) 50 of the partition panel 38 fit into the corresponding depression(s) 52 disposed in another partition panel 38 to form the slot partition 40. The projections 50 and depressions 52 may be formed as tongues and grooves that pressure fit into each other. Each partition panels 38 may be formed as a plastic formed partition panel. It should be appreciated by one of ordinary skill in the art, that the partition panels 38 may alternatively be formed of any suitable material or combination of materials, for example, but not limited to, metal or fiber glass.

The vented blanking panel 26 and the partition panels 38 are typically mechanically connected together prior to shipping. As the partition panel 38-A typically remains mechanically connected to the rear panel 30 after assembly of the slot partition 40, the partition panel 38-A may be mechanically connected to the rear panel 30 in a non-reversible fashion, without using the projections 50 and depressions 52 arrangement described above. Alternatively, the rear panel 30 of the vented blanking panel 26 may include a connecting element (such as the projection(s) 50 and/or the depression(s) 52) and the partition panel 38 may include a corresponding connecting element (such as the depression(s) 52 and/or projection(s) 50) to mechanically connect the vented blanking panel 26 and the partition panels 38-A together.

Each partition panel 38 and the slot partition 40 (formed from fitting together the partition panels 38) are substantially in the shape of an elongated cuboid. The width of the slot partition 40 is generally at least 90% of the width of the slot 12 (FIG. 1) along at least 90% of the depth of the slot partition 40. The width of the slot partition 40 is measured parallel to the direction of elongation of the vented blanking panel 26. The height of the slot partition 40 is less than 30% of the height of the slot 12 over a majority of a largest surface area of the slot partition 40. The height of the slot partition 40 is measured in a direction perpendicular to: (a) the direction of elongation of the vented blanking panel 26 and (b) the direction of extension of the slot partition 40 which is directed away from the vented blanking panel 26 into the slot 12 parallel to the direction of elongation of the support rails 14. The vented blanking panel 26 and the slot partition 40 when mechanically connected together are substantially at a right angle to each other. The width and height of the vented blanking panel 26 may be formed in any suitable width and height. By way of example only, for a Cisco Nexus rack (chassis) the width of the vented blanking panel 26 is typically 17.3". The height is typically 1.5" to 2". The partition panels 38 may be any suitable size. However, the partition panels 38 are typically sized to allow the slot partition 40 to be formed for various depths of the slots 12 that the slot-filler blanking tray 24 is being produced to accommodate. For example, the slots 12 of a Cisco Nexus chassis may have a depth of between 24" to 33". Therefore, each partition panel 38 may have a dimension of 17.3" by 4" so that 6 panels will extend to 24" and 8 panels will extend to 32", by way of example only. The thickness (height) of the panels 38 are typically slightly thinner than the gap provided by the support rails 14 and that gap is typically the thickness of the circuit board used for the computer equipment. The panels 38 could be formed as a sheet of plastic which is reinforced using ribs as shown in the figures. Alternatively, the panels 38 could be formed of thicker plastic without reinforcing ribs.

Reference is again made to FIG. 3. The rear panel 30 includes a connecting element comprising a plurality of projections 54 and/or depressions (not shown). The projection(s) 50 or the depression(s) 52 (as applicable) of each of the partition panels 38 click-fit, pressure-fit or interlock into one of the depressions or projections 54, respectively, of the rear panel 30 for storage. The partition panels 38 are mechanically connected to the rear panel 30 via the projections 54 and/or depressions (as applicable) of the rear panel 30 for storage. FIG. 3 shows four partition panels 38 being stored in the rear panel 30 with four projections 54. It will be appreciated that if more than four partition panels 38 are supplied with the slot-filler blanking tray 24, the rear panel 30 typically includes more projections 54 (and/or depressions) for storing the additional partition panels 38.

Figure 7:
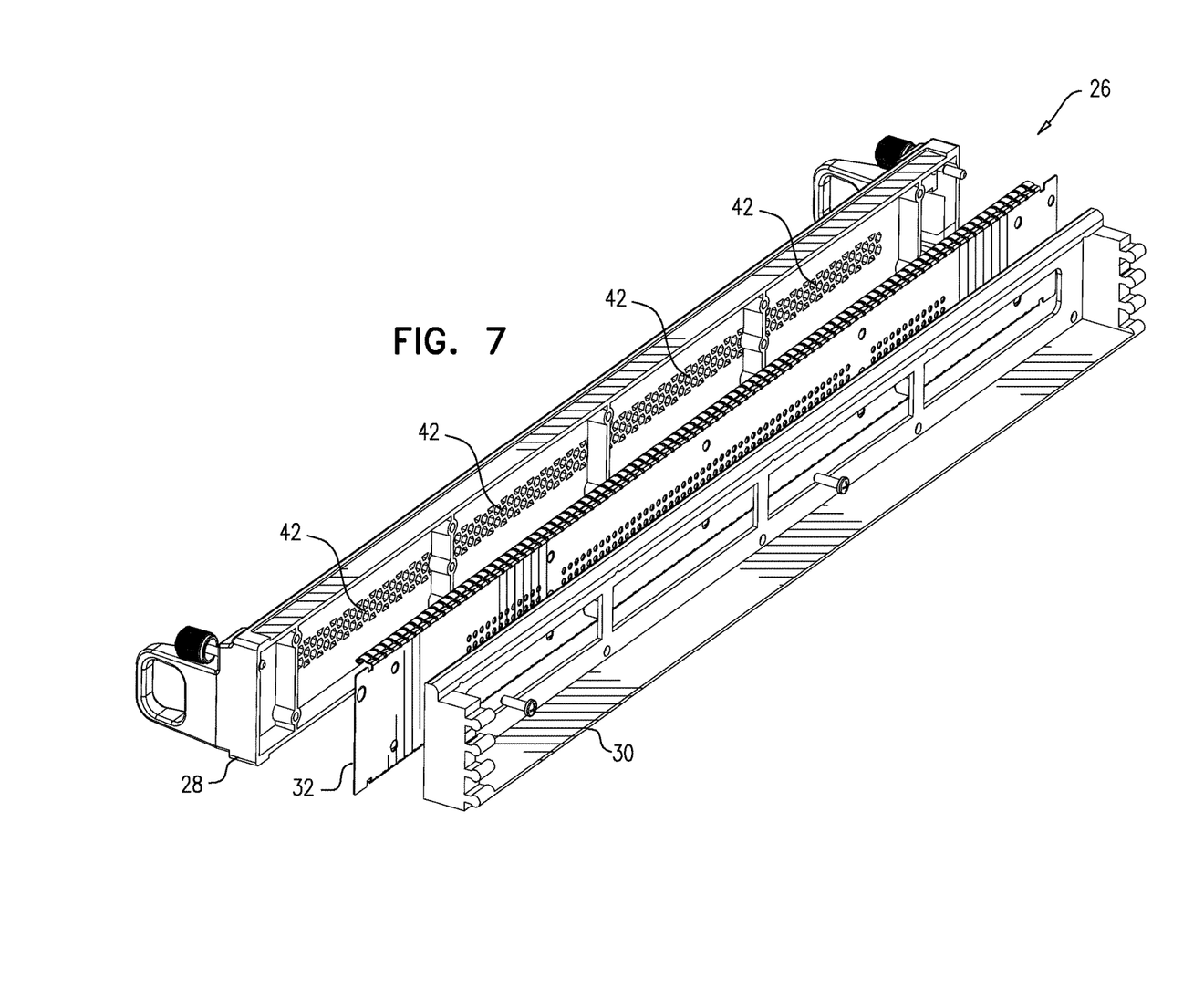
FIG. 7 is an exploded isometric view of the vented blanking panel of FIG. 6.

Reference is now made to FIG. 7, which is an exploded isometric view of the vented blanking panel 26 of FIG. 6. The electrically conductive material layer 32 may be dispensed with if the vented front panel 28 or the rear panel 30 is formed of an electrically conductive material to provide electromagnetic interference (EMI) shielding. The electrically conductive material layer 32 is disposed on the vented front panel 28 to provide electromagnetic shielding over at least 90%, and typically 100% or close to 100%, of the entrance to the slot 12 (FIG. 1) and typically provides a 360 degree perimeter seal around the entrance of the slot 12. The electrically conductive material layer 32 may be constructed from an electrically conductive material, for example, but not limited to, stainless steel or beryllium copper. The electrically conductive material layer 32 may be constructed from a solid metal sheet with openings therein positioned to correspond to the ventilation openings 42 of the vented front panel 28. The vented front panel 28, the rear panel 30 and the electrically conductive material layer 32 may be mechanically connected together via any suitable connection, for example, but not limited to, via rivets, screws, adhesive or heat staking or any suitable combination thereof.

Figure 8:
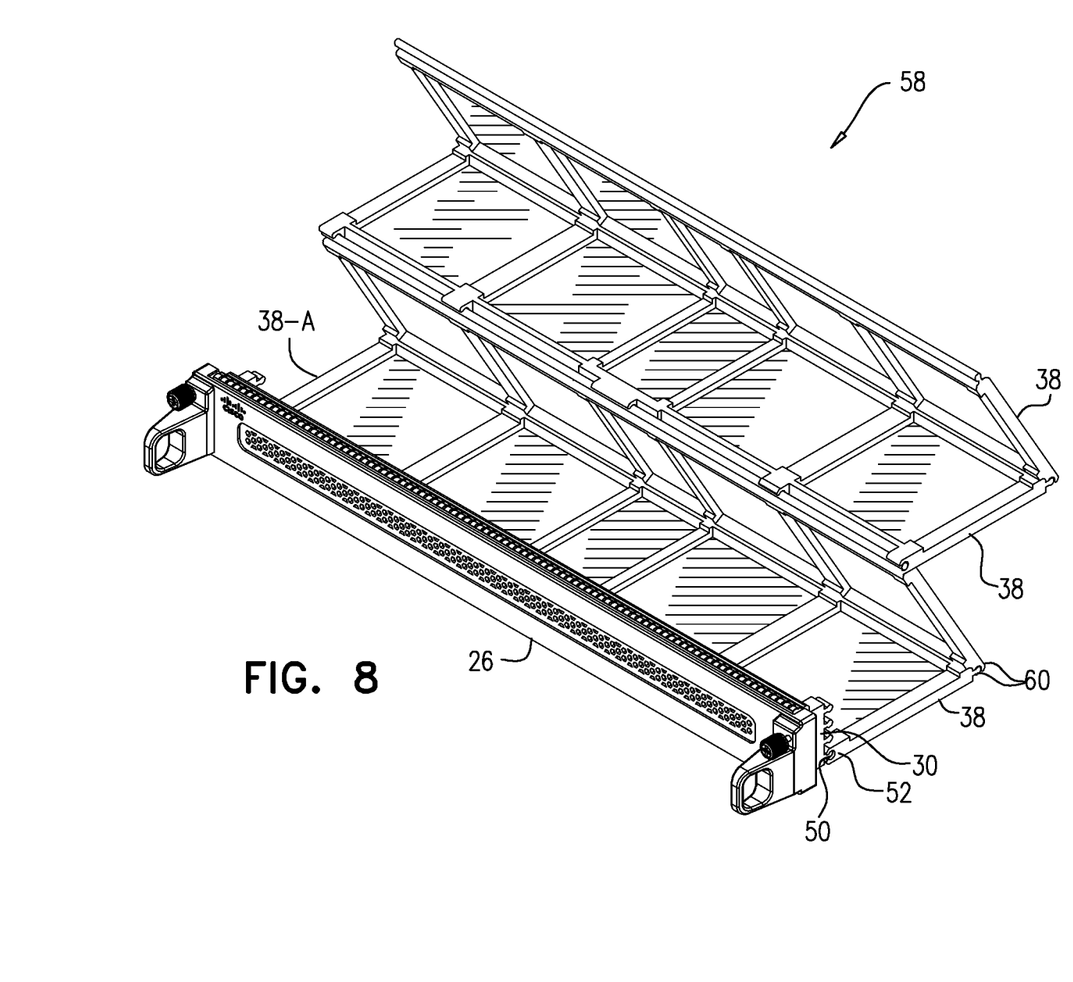
FIG. 8 is an isometric view of a slot-filler blanking tray with hinged partition panels constructed and operative in accordance with an alternative embodiment of the present disclosure.

Reference is now made to FIG. 8, which is an isometric view of a slot-filler blanking tray 58 with hinged partition panels 38 constructed and operative in accordance with an alternative embodiment of the present disclosure. The slot-filler blanking tray 58 is substantially the same as the slot-filler blanking tray 24 of FIG. 2 except that the partition panels 38 of the slot-filler blanking tray 58 are mechanically connected together with hinges so that the slot partition 40 (FIG. 2) is formed by unfolding the partition panels 38. As the partition panel 38-A typically remains mechanically connected to the rear panel 30 after unfolding of the partition panels 38 to form a slot partition (similar to the slot partition 40 of FIG. 2). The partition panel 38-A may be mechanically connected to the rear panel 30 in a non-reversible fashion, without using the projections 50 and depressions 52 arrangement described above. Alternatively, the rear panel 30 of the vented blanking panel 26 may include a connecting element (such as the projection(s) 50 and/or the depression(s) 52) and the partition panel 38-A may include a corresponding connecting element (such as the depression(s) 52 and/or projection(s) 50) to mechanically connect the vented blanking panel 26 and the partition panels 38-A together. The partition panels 38 may be formed from any suitable material, for example, but not limited to, plastic, metal, fiber glass or any suitable combination thereof. Each partition panel 38 may include at least one part of a hinge element 60 for mechanically connecting the partition panels 38 together so that when the partition panels 38 are mechanically connected together, the partition panels can fold up on top of each other for storage (shown in FIG. 9) and unfold to form the slot partition (similar to the slot partition 40 shown in FIG. 2) for inserting into the slot 12 (FIG. 1). The hinge element 60 may be constructed from any suitable material, for example, but not limited to, plastic and/or metal. The hinge parts may be at least partially integrally formed with the partition panels 38.

Figure 9:
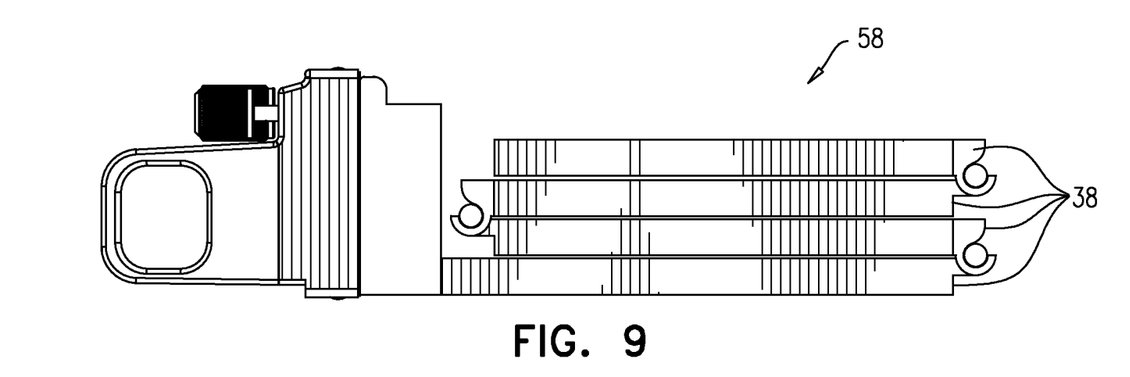
FIG. 9 is a side view of the slot-filler blanking tray with hinged partition panels of FIG. 8 in a shipping configuration.

Reference is now made to FIG. 9, which is a side view of the slot-filler blanking tray 58 with hinged partition panels 38 of FIG. 8 in a shipping configuration. FIG. 9 clearly illustrates that the partition panels 38 fold up to store on top of each other for efficient shipping and storing when not in use.

Figure 10:
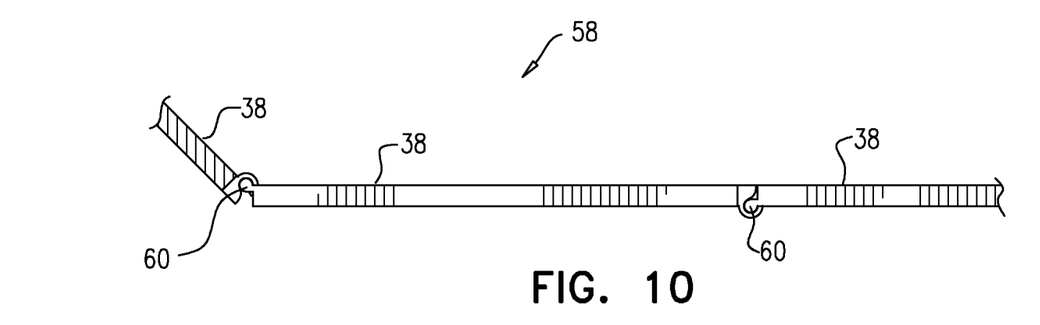
FIG. 10 is an expanded side view of the hinged partition panels of the slot-filler blanking tray of FIG. 8.

Reference is now made to FIG. 10, which is an expanded side view of the hinged partition panels 38 of the slot-filler blanking tray 58 of FIG. 8. The hinge elements 60 are arranged so that there is 180 degrees freedom of movement between adjacent partition panels 38 and the partition panels 38 can stack on top of each other by alternating the direction of the hinging movement of the hinge element 60 between one pair of the partition panels 38 and an adjacent pair of the partition panels 38.

Figure 11:
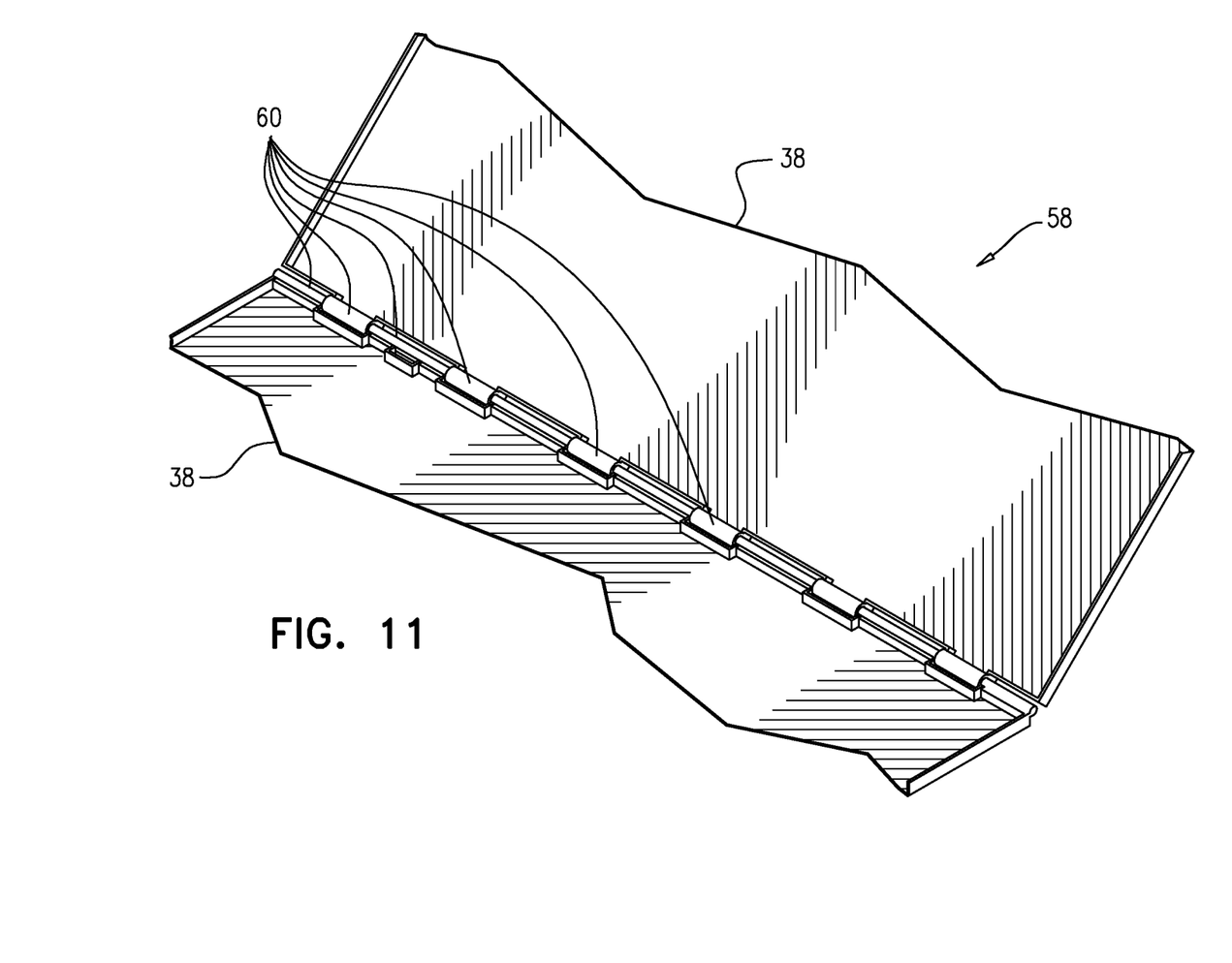
FIG. 11 is an expanded isometric view of the hinged partition panels of the slot-filler blanking tray of FIG. 8.

Reference is now made to FIG. 11, which is an expanded isometric view of the hinged partition panels 38 of the slot-filler blanking tray 58 of FIG. 8. FIG. 11 shows that one side of the hinge element 60 (e.g., hinge knuckle) may be spread apart along an edge of one of the partition panel 38 and does not necessarily need to continue from one side of the partition panel 38 to the other. The other side of the hinge element 60 (e.g., hinge pin) may continue along a complete side of one of the partition panels 38 as shown (or it may only be disposed corresponding to parts of the hinge element 60 on the adjacent partition panel 38). It should be appreciated that any suitable hinge arrangement giving the required degree of freedom of movement and the ability for the partition panels 38 to stack on top of each other may be used. It should also be appreciated that the folding nature of the hinged partition panels 38 may be used to alter the length of the slot partition 40 (FIG. 2). Alternatively, the hinged partition panels 38 may be reversibly mechanically connected so that any one or more of the hinged partition panels 38 may be removed from the slot partition 40 so that the length of the slot partition 40 may be configured to be as close to the depth of the slot 12 (FIG. 1) as possible.

Reference is again made to FIGS. 2 and 8. A method of manufacturing the slot-filler blanking tray 24 and the slot-filler blanking tray 58 is now described. The method includes the following steps: (i) forming the vented blanking panel 26 including forming the vented front panel 28 with the ventilation openings 42, forming the rear panel 30 and forming the electrically conductive material layer 32; (ii) mechanically connecting the vented front panel 28 to the rear panel 30 while sandwiching the electrically conductive material layer 32 between the vented front panel 28 and the rear panel 30; (iii) forming the panel arrangement including the partition panels 38 to form the slot partition 40 for reversibly inserting into the slot 12 (FIG. 1) wherein each partition panel 38 is formed either by: (a) including the projection 50 disposed at one edge of the partition panel 38 and a corresponding depression 52 disposed at another edge of the partition panel 38, the projection 50 and the depression 52 being formed so that the projection 50 of the partition panel 38 may fit into the corresponding depression 52 disposed in another partition panel 38 to form the slot partition 40; or (b) including at least one part of a hinge element 60 (FIG. 8) with the partition panel 38 for mechanically connecting the partition panels 38 together so that when the partition panels 38 are mechanically connected together, the partition panels 38 can fold up on top of each other for storage and unfold to form the slot partition 40 for inserting into the slot 12; (iv) mechanically connecting the vented blanking panel 26 and the partition panel 38-A together or forming the vented blanking panel 26 to include at least one connecting element (e.g., the projection(s) 54 of FIG. 3) and the partition panel 38-A (and optionally all the partition panels 38) to include at least one connecting element (e.g., the depressions 52 of FIG. 3), the connecting elements 52, 54 being used to mechanically connect the vented blanking panel 26 and the partition panel(s) 38 together.

It will be appreciated that various features of the disclosure which are, for clarity, described in the contexts of separate embodiments may also be provided in combination in a single embodiment. Conversely, various features of the disclosure which are, for brevity, described in the context of a single embodiment may also be provided separately or in any suitable sub-combination.

It will be appreciated by persons skilled in the art that the present disclosure is not limited by what has been particularly shown and described hereinabove. Rather the scope of the disclosure is defined by the appended claims and equivalents thereof.

What is claimed is:
1. A slot-filler blanking tray comprising:
a vented blanking panel including a vented front panel with ventilation openings, the vented blanking panel for fitting over an entrance to one slot of a plurality of slots of a computer equipment rack for rack-mounted computer equipment, each of the plurality of slots having a depth, a width, and a height, and including a plurality of support rails for supporting a piece of computer equipment; and
a panel arrangement including a plurality of partition panels to form a slot partition for reversibly inserting into the one slot, supported by the support rails of the one slot and extending from the entrance of the one slot into at least 70% of the depth of the one slot, the slot partition being formed either by unfolding the plurality of partition panels or fitting the plurality of partition panels together, wherein: (a) the vented blanking panel and at least one partition panel of the plurality of partition panels are mechanically connected together, each one partition panel of the plurality of partition panels including at least one part of a hinge element for mechanically connecting the plurality of partition panels together so that when the plurality of partition panels are mechanically connected together, the plurality of partition panels can fold up on top of each other for storage and unfold to form the slot partition for inserting into the one slot; or (b) the vented blanking panel includes a first connecting element and at least one partition panel of the plurality of partition panels includes a second connecting element to mechanically connect the vented blanking panel and the at least one partition panel together, each one partition panel of the plurality of partition panels including a projection disposed at one edge of the one partition panel and a corresponding depression disposed at another edge of the one partition panel, the projection and the depression being formed so that the projection of the one partition panel may fit into the corresponding depression disposed in another partition panel of the plurality of partition panels to form the slot partition, the second connecting element of the at least one partition panel being the projection or the depression of the at least one partition panel.

2. The slot-filler blanking tray according to claim 1, wherein: the vented front panel is plastic formed; and the vented blanking panel further comprises an electrically conductive material layer mechanically connected to the vented front panel, the electrically conductive material layer being disposed on the vented front panel to provide electromagnetic shielding over at least 90% of the entrance to the one slot.

3. The slot-filler blanking tray according to claim 2, wherein the vented blanking panel further comprises a plastic formed rear panel including the first connecting element, the electrically conductive material layer being sandwiched between the vented front panel and the rear panel.

4. The slot-filler blanking tray according to claim 1, wherein each of the plurality of partition panels and the slot partition formed from the plurality of partition panels is substantially in the shape of an elongated cuboid.

5. The slot-filler blanking tray according to claim 1, wherein: the slot partition has a width and a depth and a height; and the width of the slot partition is at least 90% of the width of the one slot along at least 90% of the depth of the slot partition.

6. The slot-filler blanking tray according to claim 5, wherein the height of the slot partition is less than 30% of the height of the one slot over a majority of a largest surface area of slot partition.

7. The slot-filler blanking tray according to claim 1, wherein the vented blanking panel and the slot partition when mechanically connected together are substantially at a right angle to each other.

8. The slot-filler blanking tray according to claim 1, wherein each one partition panel of the plurality of partition panels includes the projection disposed at one edge of the one partition panel and the corresponding depression disposed at the other edge of the one partition panel, the projection and the depression being formed so that the projection of the one partition panel may fit into the corresponding depression disposed in another partition panel of the plurality of partition panels to form the slot partition.

9. The slot-filler blanking tray according to claim 1, wherein: the vented blanking panel includes a rear panel comprising the first connecting element, the first connecting element comprising a plurality of projections and/or depressions; and the projection or the depression of each of the plurality of partition panels fit into one of the plurality of depressions or projections, respectively, of the rear panel.

10. The slot-filler blanking tray according to claim 9, wherein the rear panel is plastic formed.

11. The slot-filler blanking tray according to claim 9, wherein the plurality of partition panels are mechanically connected to the rear panel via the plurality of projections and/or depressions of the rear panel for storage.

12. The slot-filler blanking tray according to claim 1, wherein each one partition panel of the plurality of partition panels includes the at least one part of the hinge element for mechanically connecting the plurality of partition panels together so that when the plurality of partition panels are mechanically connected together, the plurality of partition panels can fold up on top of each other for storage and unfold to form the slot partition for inserting into the one slot.

13. The slot-filler blanking tray according to claim 1, wherein the vented front panel includes a handle at each side of the front panel for inserting the slot-filler blanking tray into the one slot and removing the slot-filler from the one slot.

14. The slot-filler blanking tray according to claim 1, wherein front panel has a plurality of fastening elements for fastening the slot-filler blanking tray in the one slot.

15. The slot-filler blanking tray according to claim 14, wherein the fastening elements comprise thumb screws.

16. The slot-filler blanking tray according to claim 14, wherein the fastening elements comprise sprung clips.

17. A method of manufacturing a slot-filler blanking tray, the method comprising:
    forming a vented blanking panel including a vented front panel with ventilation openings, the vented blanking panel for fitting over an entrance to one slot of a plurality of slots of a computer equipment rack for rack-mounted computer equipment, each of the plurality of slots including a plurality of support rails for supporting a piece of computer equipment thereon; and
    forming a panel arrangement including a plurality of partition panels to form a slot partition for reversibly inserting into the one slot, supported by the support rails of the one slot and extending from the entrance of the one slot to at least 70% of the depth of the one slot, wherein each one partition panel of the plurality of partition panels is formed either by: (a) including a projection disposed at one edge of the one partition panel and a corresponding depression disposed at another edge of the one partition panel, the projection and the depression being formed so that the projection of the one partition panel may fit into the corresponding depression disposed in another partition panel of the plurality of partition panels to form the slot partition; or (b) including at least one part of a hinge element with the one partition panel for mechanically connecting the plurality of partition panels together so that when the plurality of partition panels are mechanically connected together, the plurality of partition panels can fold up on top of each other for storage and unfold to form the slot partition for inserting into the one slot; and
    mechanically connecting the vented blanking panel and at least one partition panel of the plurality of partition panels together or forming the vented blanking panel to include a connecting element to mechanically connect the vented blanking panel with the at least one partition panel.

18. The method according to claim 17, further comprising: forming a rear panel comprising the connecting element, the connecting element comprising a plurality of projections and/or depressions, the projection or the depression of each of the plurality of partition panels fitting into one of the plurality of depressions or projections, respectively, of the rear panel; and mechanically connecting the vented front panel and the rear panel.

19. The method according to claim 17, wherein the vented front panel is plastic formed, and further comprising: forming an electrically conductive material layer; and mechanically connecting the electrically conductive material layer to the vented front panel, the electrically conductive material layer being disposed on the vented front panel to provide electromagnetic shielding over at least 90% of the entrance to the one slot.

20. A slot-filler blanking tray comprising:
- a vented blanking panel including: a plastic formed vented front panel with ventilation openings; and an electrically conductive material layer mechanically connected to the plastic formed vented front panel, the vented blanking panel for fitting over an entrance to one slot of a plurality of slots of a computer equipment rack for rack-mounted computer equipment, each of the plurality of slots having a depth, a width, and a height, and including a plurality of support rails for supporting a piece of computer equipment, the electrically conductive material layer being disposed on the vented front panel to provide electromagnetic shielding over the entrance to the one slot; and
- a panel arrangement including a plurality of plastic formed partition panels to form a slot partition for reversibly inserting into the one slot, supported by the support rails of the one slot and extending from the entrance of the one slot into the one slot, the slot partition being formed either by unfolding the plurality of partition panels or fitting the plurality of partition panels together, wherein: (a) the vented blanking panel and at least one partition panel of the plurality of partition panels are mechanically connected together; or (b) the vented blanking panel includes a first connecting element and the at least one partition panel includes a second connecting element to mechanically connect the vented blanking panel and the at least one partition panel together.

* * * * *